(12) United States Patent
Sang et al.

(10) Patent No.: US 11,515,444 B2
(45) Date of Patent: Nov. 29, 2022

(54) MICRO LIGHT EMITTING DIODE SUBSTRATE, MANUFACTURING METHOD FOR SAME, AND DISPLAY DEVICE

(71) Applicant: ELEC-TECH PHOTOELECTRIC TECHNOLOGY (DALIAN) CO., LTD., Liaoning (CN)

(72) Inventors: Yongchang Sang, Dalian (CN); Shunli Chen, Dalian (CN); Minghai Zhao, Dalian (CN)

(73) Assignee: ELEC-TECH PHOTOELECTRIC TECHNOLOGY (DALIAN) CO., LTD., Liaoning (CN)

( * ) Notice: Subject to any disclaimer, the term of this patent is extended or adjusted under 35 U.S.C. 154(b) by 20 days.

(21) Appl. No.: 17/259,037

(22) PCT Filed: Dec. 29, 2018

(86) PCT No.: PCT/CN2018/125419
§ 371 (c)(1),
(2) Date: Jan. 8, 2021

(87) PCT Pub. No.: WO2020/010820
PCT Pub. Date: Jan. 16, 2020

(65) Prior Publication Data
US 2021/0273130 A1    Sep. 2, 2021

(30) Foreign Application Priority Data

Jul. 11, 2018  (CN) .......................... 201810757202.9

(51) Int. Cl.
*H01L 33/00* (2010.01)
*H01L 25/075* (2006.01)

(52) U.S. Cl.
CPC ...... *H01L 33/0093* (2020.05); *H01L 25/0753* (2013.01); *H01L 33/0095* (2013.01)

(58) Field of Classification Search
None
See application file for complete search history.

(56) References Cited

U.S. PATENT DOCUMENTS

| | | | |
|---|---|---|---|
| 8,349,116 B1 | 1/2013 | Bibl et al. | |
| 10,096,740 B1 * | 10/2018 | Chen | H01L 27/156 |

(Continued)

FOREIGN PATENT DOCUMENTS

| | | |
|---|---|---|
| CN | 101018643 A | 8/2007 |
| CN | 107017319 A | 8/2017 |

(Continued)

*Primary Examiner* — Bradley Smith
(74) *Attorney, Agent, or Firm* — Polsinelli PC (57) ABSTRACT

Disclosed are a micro light emitting diode substrate, a manufacturing method thereof, and a display device. At first step, providing a first growth substrate having a first growth surface which is provided with a first color micro light emitting diode unit; at second step, providing a receiving substrate having a receiving surface on which a plurality of receiving pads are arranged at intervals; at third step, fitting the first growth substrate to the receiving substrate such that each first color micro light emitting diode unit at a transfer position is fitted to one receiving pad; at fourth step, fixing the first color micro light emitting diode unit to the receiving surface through the receiving pad; at fifth step, peeling off the first color micro light emitting diode unit from the first growth substrate, to obtain the receiving substrate on which the first color micro light emitting diode unit is fixed.

13 Claims, 4 Drawing Sheets

(56) References Cited

U.S. PATENT DOCUMENTS

| | | | |
|---|---|---|---|
| 2003/0020084 A1 | 1/2003 | Fan et al. | |
| 2018/0069149 A1* | 3/2018 | Zou | H01L 33/20 |
| 2018/0261785 A1* | 9/2018 | Ahmed | H01L 51/5012 |
| 2021/0135044 A1* | 5/2021 | Zou | H01L 33/0093 |

FOREIGN PATENT DOCUMENTS

| | | | | |
|---|---|---|---|---|
| CN | 107146835 A | 9/2017 | | |
| CN | 107431107 A | 12/2017 | | |
| CN | 107910414 A | 4/2018 | | |
| CN | 108140664 A | 6/2018 | | |
| CN | 108538878 A | 9/2018 | | |
| WO | WO-2018191883 A1 * | 10/2018 | | G09F 9/33 |

* cited by examiner

MICRO LIGHT EMITTING DIODE SUBSTRATE, MANUFACTURING METHOD FOR SAME, AND DISPLAY DEVICE

CROSS REFERENCE TO RELATED APPLICATION

The present application is a National Stage of International Application PCT/CN2018/125419, filed on Dec. 29, 2018, which claims priority to Chinese Patent Application No. 201810757202.9, filed on Jul. 11, 2018 and entitled "Micro Light Emitting Diode Substrate, Manufacturing Method for Same, and Display Device", and the content of which is herein incorporated by reference in its entireties.

TECHNICAL FIELD

The present disclosure relates to the field of micro light emitting diode for display, and particularly to a micro light emitting diode substrate and a manufacturing method for the same, and a display device.

BACKGROUND

A micro LED refers to a small-sized LED array integrated on a substrate with a high density. At present, the micro light emitting diode technology has begun to develop, and the industry is looking forward to high-quality micro light emitting diode products entering the market. The high-quality micro light emitting diode products will have a profound impact on conventional display products such as LCD/OLED already in the market.

How to transfer the micro light emitting diode from an original growth substrate to a receiving substrate is a difficulty in manufacturing the display device. In the conventional micro light emitting diode manufacturing technology, the micro light emitting diode is first transferred from the growth substrate to a transitional temporary substrate, and then the micro light emitting diode is transferred from the temporary substrate to the final receiving substrate, and finally is fixed on the receiving substrate through the die bonding technology. Such method with the transitional temporary transfer of the substrate, on the one hand, is low in production efficiency; and on the other hand, multiple transfers are likely to cause low yield of the micro light emitting diodes that are finally transferred to the receiving substrate. For example, the micro light emitting diodes miss on the growth substrate or the temporary substrate, and micro light emitting diodes transferred to the final receiving substrate have conditions such as offset, rotation, and tilt, etc.

SUMMARY

In view of this, as for the problems of low efficiency and low yield of the micro light emitting diodes in the transfer process, it is necessary to provide a micro light emitting diode substrate and a manufacturing method for the same, and a display device.

The present disclosure provides a micro light emitting diode substrate and a manufacturing method for the same, and a display device. At S110, providing a first growth substrate, the first growth substrate having a first growth surface, and the first growth surface being provided with a first color micro light emitting diode unit; at S120, providing a receiving substrate, the receiving substrate having a receiving surface, and a plurality of receiving pads being arranged on the receiving surface at intervals; at S130, fitting the first growth substrate to the receiving substrate such that each first color micro light emitting diode unit at a transfer position is fitted to one receiving pad; at S140, fixing the first color micro light emitting diode unit to the receiving surface through the receiving pad; at S150, peeling off the first color micro light emitting diode unit from the first growth substrate, to obtain the receiving substrate on which the first color micro light emitting diode unit is fixed.

In an embodiment, the S140 includes:

S141: providing a first mask, the first mask being provided on a side of the first growth substrate away from the first growth surface, and irradiating, by an infrared laser, a side of the first mask away from the first growth substrate;

S142: fixing a plurality of first color micro light emitting diode units to the receiving surface through the receiving pads.

In an embodiment, in the S141, the first mask is provided with at least one opening.

In an embodiment, the S150 includes:

S151: switching the infrared laser to an ultraviolet laser, providing a second mask, the second mask being provided on a side of the first growth substrate away from the first growth surface, and irradiating, by the ultraviolet laser, a side of the second mask away from the first growth substrate;

S152: absorbing, by the first color micro light emitting diode unit, an energy generated by the ultraviolet laser to decompose and vaporize, to implement the peeling off from the first growth surface of the first growth substrate.

In an embodiment, in the S151, the second mask and the first mask are a same mask.

In an embodiment, the infrared laser or the ultraviolet laser is a large spot laser, a linear spot laser, or a point spot laser.

In an embodiment, in the S130, a micro light emitting diode pad is provided on a side of each first color micro light emitting diode unit at the transfer position, the side is fitted to the receiving pad, and a welding material layer 43 is provided on a side of the micro light emitting diode pad fitted to the receiving pad.

In an embodiment, the method for manufacturing the micro light emitting diode substrate further includes:

S210: providing a second growth substrate, the second growth substrate having a second growth surface, and the second growth surface being provided with a second color micro light emitting diode unit;

S220: fitting the receiving substrate on which the first color micro light emitting diode unit is fixed to the second growth substrate, such that each second color micro light emitting diode unit at a transfer position is fitted to one receiving pad;

S230: fixing the second color micro light emitting diode unit to the receiving surface through the receiving pad;

S240: peeling off the second color micro light emitting diode unit from the second growth substrate, to obtain the receiving substrate on which the first color micro light emitting diode unit and the second color micro light emitting diode unit are fixed.

In an embodiment, the manufacturing method further includes:

S310: providing a third growth substrate, the third growth substrate having a third growth surface, and the third growth surface being provided with a third color micro light emitting diode unit;

S320: fitting the receiving substrate on which the first color micro light emitting diode unit and the second color micro light emitting diode unit are fixed to the third growth substrate, such that each third color micro light emitting diode unit at a transfer position is fitted to one receiving pad;

S330: fixing the third color micro light emitting diode unit to the receiving surface through the receiving pad;

S340: peeling off the third color micro light emitting diode unit from the third growth substrate, to obtain the receiving substrate on which the first color micro light emitting diode unit, the second color micro light emitting diode unit and the third color micro light emitting diode unit are fixed.

In an embodiment, the method for manufacturing the micro light emitting diode substrate further includes: at S350, providing a protective layer and a transparent electrode layer in sequence on a surface of each of the first color micro light emitting diode unit, the second color micro light emitting diode unit and the third color micro light emitting diode unit which are transferred to the receiving substrate.

In an embodiment, any one, two or three of the first color micro light emitting diode unit, the second color micro light emitting diode unit, and the third color micro light emitting diode unit have a vertical structure.

In an embodiment, a thickness of the protective layer is in a range of 0.1 um to 3 um.

In an embodiment, a micro light emitting diode substrate is provided, which is formed by the method for manufacturing the micro light emitting diode substrate of any one of the above-mentioned embodiments.

In an embodiment, a display device is provided, which includes the micro light emitting diode substrate of any one of the above embodiments.

In the embodiment, the first growth substrate provided with a plurality of first color micro light emitting diode units is fitted to the receiving substrate provided with a plurality of receiving pads, such that each first color micro light emitting diode unit is fitted to one receiving pad. The plurality of first color micro light emitting diode units are fixed on the receiving surface through the receiving pads. Then, the first color micro light emitting diode units are peeled off from the first growth substrate to obtain the receiving substrate on which the first color micro light emitting diode units are fixed. Since the first color micro light emitting diode unit and the receiving substrate are die-bonded before the peeling off, there is a large binding force between the first color micro light emitting diode unit and the receiving substrate, which can prevent the force between the first growth substrate and the first color micro light emitting diode unit from interfering with the spatial state of the first color micro light emitting diode unit after peeling off, such as offset, rotation, tilt, etc., and accordingly the transfer yield of the first color micro light emitting diode unit can be improved. In addition, the first color micro light emitting diode unit is directly transferred from the first growth substrate to the receiving substrate, which can also avoid the omission of the first color micro light emitting diode unit caused by the transitional temporary transfer of the substrate and the low transfer efficiency.

DESCRIPTION OF REFERENCE SIGNS 10, first growth substrate;
110, first growth surface;
120, first color micro light emitting diode unit;
20, second growth substrate;
210, second growth surface;
220, second color micro light emitting diode unit;
30, third growth substrate;
310, third growth surface;
320, third color micro light emitting diode unit;
40, receiving substrate;
41, receiving pad;
42, micro light emitting diode pad;
43, welding material layer;
410, receiving surface;
50, first mask;
51, second mask;
60, transparent electrode layer;
70, protective layer;
80, micro light emitting diode substrate.

DETAILED DESCRIPTION

In order to make the objectives, technical solution, and advantages of the present disclosure clearer, a micro light emitting diode substrate, a manufacturing method for the same, and s display device of the present disclosure will be further detailed below through embodiments in conjunction with accompanying drawings. It should be appreciated that the specific embodiments described here are merely used for explaining the disclosure, rather than limiting the present disclosure.

Hereinafter, the micro light emitting diode substrate and the manufacturing method for the same, and the display device of the embodiments of the present disclosure will be described in detail with reference to the drawings.

The present disclosure provides a method for manufacturing a micro light emitting diode substrate, which includes the following steps.

Figure 1:
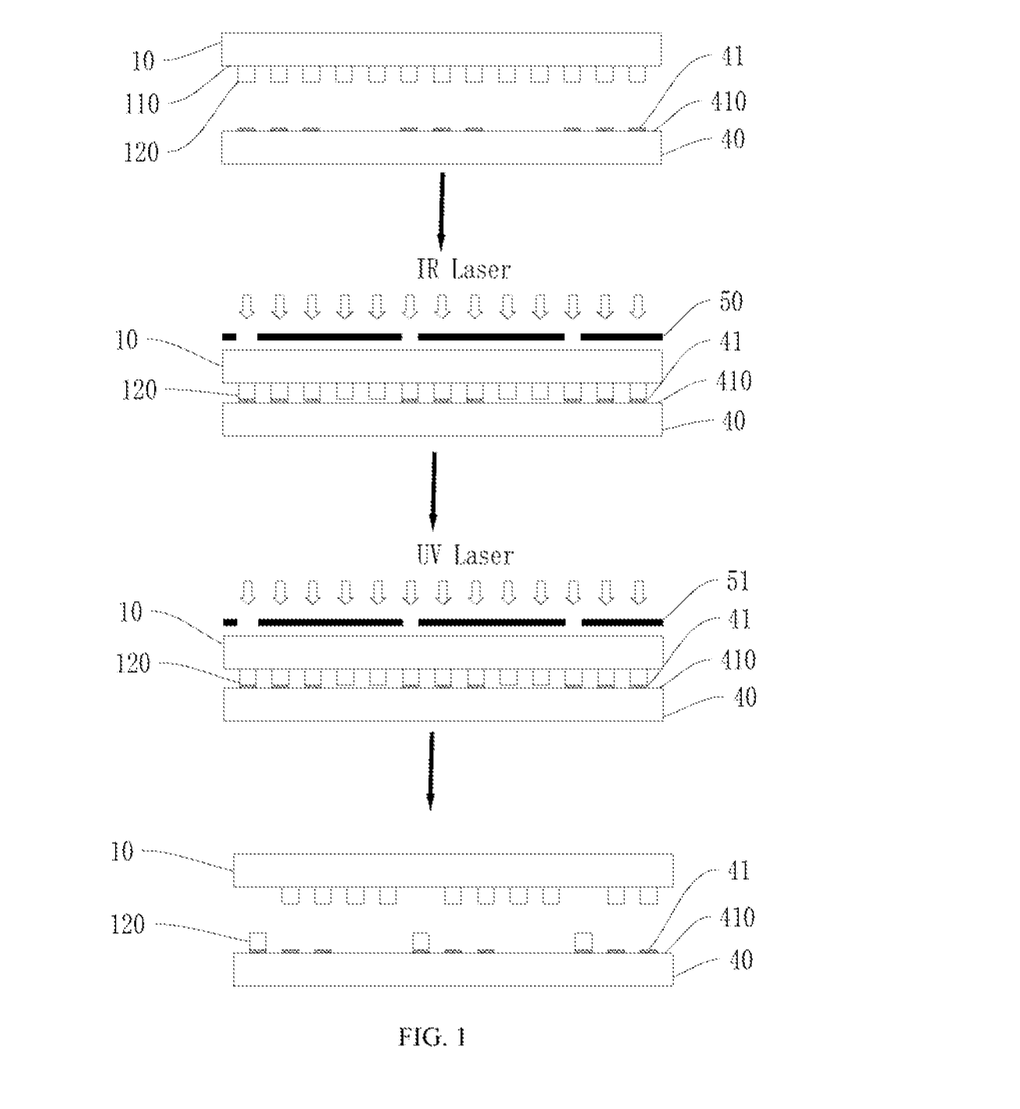
FIG. 1 is a flow chart showing die bonding and peeling of a first color micro light emitting diode unit according to an embodiment of the present disclosure.

S110: a first growth substrate 10 is provided, which has a first growth surface 110, and the first growth surface 110 is provided with a first color micro light emitting diode unit 120.

S120: a receiving substrate 40 is provided, which has a receiving surface 410, and a plurality of receiving pads 41 are provided on the receiving surface 410 at intervals.

S130: the first growth substrate 10 is fitted to the receiving substrate 40, such that each first color micro light emitting diode unit 120 at a transfer position is fitted to one receiving pad 41.

S140: the first color micro light emitting diode unit 120 is fixed to the receiving surface 410 through the receiving pad 41.

S150: the first growth substrate 10 is peeled off from the first color micro light emitting diode unit 120 to obtain the receiving substrate 40 on which the first color micro light emitting diode unit 120 is fixed.

In the step S110, the first growth substrate 10 can be a sapphire substrate, a SiC substrate, or the like. A plurality of the first color micro light emitting diode units 120 are formed on the first growth surface 110 of the first growth substrate 10. The plurality of the first color micro light emitting diode units 120 can form a micro light emitting diode array. The first growth substrate 10 can be partitioned or divided into a plurality of units, which can facilitate the transfer more flexible. The color of the first color micro light emitting diode unit 120 is any one of red, green, and blue.

In the step S120, the plurality of the receiving pads 41 are provided on the receiving surface 410 at intervals. The receiving pad 41 is made of a metal material and can conduct the micro light emitting diode unit provided on the receiving substrate 40. Each receiving pad 41 can be provided with a positive electrode and a negative electrode at the same time, or only provided with a positive electrode, which is not limited herein.

In an embodiment, when the first color micro light emitting diode unit 120 has a flip-chip structure, each receiving pad 41 is provided with a positive electrode and a negative electrode at the same time. The P electrode and the N electrode of the first color micro light emitting diode unit 120 having the flip-chip structure are respectively fitted to the positive electrode and the negative electrode of the receiving pad 41, to conduct the first color micro light emitting diode unit 120.

In another embodiment, when the first color micro light emitting diode unit 120 has a vertical structure, the receiving pad 41 is only provided with a positive electrode. The P electrode of the first color micro light emitting diode unit 120 is fitted to the receiving pad 41 to achieve the conduction.

In S130, the first growth substrate 10 is fitted to the receiving substrate 40, so that each first color micro light emitting diode unit 120 at the transfer position is fitted to one receiving pad 41. Each first color micro light emitting diode unit 120 at the transfer position corresponds to one receiving position on the receiving surface 410. In this embodiment, the receiving substrate 40 is configured to provide a plurality of pixels, and each pixel point can receive a plurality of micro light emitting diode units of different colors. The receiving position refers to a position at which the pixel point does not receive the micro light emitting diode unit but is ready to receive the first color micro light emitting diode unit 120.

In this embodiment, the first growth substrate 10 provided with a plurality of first color micro light emitting diode units 120 is fitted to the receiving substrate 40 provided with a plurality of receiving pads 41, such that each first color micro light emitting diode unit 120 is fitted to one receiving pad 41. The plurality of first color micro light emitting diode units 120 are fixed to the receiving surface 410 through the receiving pads 41. Then, the first growth substrate 10 is peeled off from the first color micro light emitting diode units 120 to obtain the receiving substrate 40 on which the first color micro light emitting diode units 120 are fixed. Before the peeling, the first color micro light emitting diode unit 120 and the receiving substrate 40 completes the die bonding, accordingly the first color micro light emitting diode unit 120 and the receiving substrate 40 also have a great bonding force, which can prevent a force between the first growth substrate 10 and the first color micro light emitting diode unit 120 from interfering with a spatial state of the first color micro light emitting diode unit 120 after the peeling, such as shifting, rotation, tilt, etc., and then the transfer yield of the first color micro light emitting diode unit can be improved. In addition, the first color micro light emitting diode unit 120 is directly transferred from the first growth substrate 10 to the receiving substrate 40, which can also avoid omission of the first color micro light emitting diode unit caused by transitional temporary transfer of the substrate and the low transfer efficiency.

In an embodiment, the S140 includes following steps.

S141: a first mask 50 is provided, the first mask 50 is provided on a side of the first growth substrate 10 away from the first growth surface 110, and a side of the first mask 50 away from the first growth substrate 10 is irradiated by an infrared laser.

S142: a plurality of first color micro light emitting diode units 120 are fixed to the receiving surface 410 through the receiving pads 41.

In this embodiment, the first mask 50 is a mask corresponding to transfer of the first color micro light emitting diode units 120. The first mask 50 can be a mask independent of the first growth substrate 10, or a mask which is integrated on the first growth substrate 10 and made by photolithography, coating, or other processes, which is not limited here. In this embodiment, the first mask 50 can be a mask independent of the first growth substrate 10. The mask independent of the first growth substrate 10 can be reused, which can reduce the production cost. In addition, the mask independent of the first growth substrate 10 can be combined with a precision lens system to achieve a higher precision, and can implement a high precision alignment.

In this embodiment, the first mask 50 can be made of one or more layers of materials with good thermal conductivity, certain rigidity and toughness, and good stability at a high temperature. For example, the material of the first mask 50 includes stainless steel, copper or alloys thereof. The first mask 50 is provided with an opening, and the opening corresponds to at least one first color micro light emitting diode unit 120. In such a way, the first color micro light emitting diode unit 120 corresponding to the opening position can be selectively die-bonded and peeled off from the first growth substrate 10, and transferred to the receiving substrate 40.

In this embodiment, with the first mask 50, the first growth substrate 10 is irradiated with an infrared laser from the side of the first growth substrate 10 away from the receiving substrate 40. The first growth substrate 10 and the epitaxial layer are transparent to infrared wavelengths, and only the metal absorbs energy of the infrared laser. The metal material on the surface of the micro light emitting diode pad 42 absorbs the energy generated by the infrared wavelengths, so that the first color micro light emitting diode unit 120 and the receiving pad 41 can be die-bonded and fixed to the receiving substrate 40. The first mask 50 can be designed in different shapes and sizes as required. At the same time, due to the selectivity of die bonding, the defective points on the micro light emitting diode array can be avoided purposefully, and the yield of the product can be improved. The infrared laser for implementing selective die bonding can be a laser with a large spot, which covers the entire effective area of the mask at once, and uses the shielding of the first mask 50 to implement the selective die bonding. The infrared laser can also be a linear spot laser or a point spot laser, and gradually scans the first mask 50 to implement the selective die bonding.

In an embodiment, in the step S141, the first mask 50 is provided with at least one opening.

In this embodiment, the first mask 50 is provided with at least one opening. By arranging a plurality of openings on the surface of the first mask 50, the first color micro light emitting diode units 120 corresponding to the positions of the plurality of openings can be selectively die-bonded, peeled off, and transferred to the receiving substrate 40. In such a way, a designated first color micro light emitting diode unit 120 can be selectively transferred to the receiving substrate 40, thereby improving the utilization and transfer efficiencies of the first color micro light emitting diode unit 120.

In an embodiment, when there are a plurality of defective pixel points on the finished micro light emitting diode display panel, the first mask 50 can be provided with a plurality of openings corresponding to the positions of the plurality of defective pixel points, so that the plurality of defective pixel points can be repaired.

In an embodiment, the first mask 50 is provided with only one opening. In this way, when there are defective pixel points on the finished micro light emitting diode display panel, the die bonding is selectively performed and a single micro light emitting diode is peeled off to replace the defective pixel point to implement the repair. In an embodiment, the step S150 includes following steps.

S151: the laser is switched from the infrared laser to an ultraviolet laser, and a second mask 51 is provided, the second mask 51 is provided on the side of the first growth substrate 10 away from the growth surface 110, and the side of the first mask 50 away from the first growth substrate 10 is irradiated by the ultraviolet laser.

S152: the first color micro light emitting diode unit 120 absorbs energy generated by the ultraviolet laser to decompose and vaporize, to implement the peeling off from the first growth surface 110 of the first growth substrate 10.

In this embodiment, after the die bonding is completed, the laser light source is switched, and the ultraviolet laser is utilized to cooperate with the second mask 51 to selectively perform the peeling. The ultraviolet laser irradiates on the side of the first growth substrate 10 away from the receiving substrate 40. The first growth substrate 10 is transparent to the wavelength of the ultraviolet laser, and the epitaxial layer absorbs the wavelength of the ultraviolet laser to generate heat to decompose and vaporize, to peel the epitaxial layer of the first color micro light emitting diode unit 120 from the first growth substrate 10.

In an embodiment, in the step S151, the second mask 51 and the first mask 50 are the same mask.

In this embodiment, the second mask 51 and the first mask 50 are the same mask. In such a way, after the die bonding process is completed, the peeling process can be performed by directly switching the infrared laser to the ultraviolet laser on the same laser device. In such a way, not only the production efficiency is improved, but also the production cost is reduced.

In an embodiment, the infrared laser or the ultraviolet laser is a large spot laser, a linear spot laser or a point spot laser.

In this embodiment, the infrared laser or the ultraviolet laser can be a large spot laser, a linear spot laser, or a point spot laser. When the infrared laser or the ultraviolet laser is a large spot laser, the entire effective area of the mask can be covered at once, and the shielding of the first mask 50 or the second mask 51 are utilized to implement the selective die bonding or selective peeling. When the infrared laser or the ultraviolet laser is a linear spot laser or a point spot laser, the infrared laser and the ultraviolet laser can gradually scan the first mask 50 or the second mask 51, to implement the selective peeling. In an embodiment, in the step S130, a micro light emitting diode pad 42 is provided on a side of the first color micro light emitting diode unit 120 at the transfer position, in which the side is fitted to the receiving pad 41; and a welding material layer 43 is provided on a side of the micro light emitting diode pad 42 fitted to the receiving pad 41.

Figure 5:
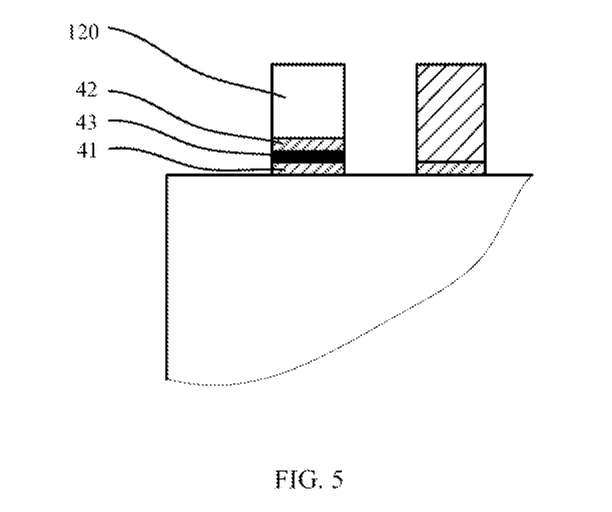
FIG. 5 is a larger view of a part shown in the circle in the FIG. 4.

In this embodiment, the micro light emitting diode pad 42 is provided on the side of the first color micro light emitting diode unit 120 fitted to the receiving pad 41. The micro light emitting diode pad 42 is the first electrode of the micro light emitting diode. By pre-plating the welding material layer 43 on the micro light emitting diode pad 42, the micro light emitting diode pad material can absorb the energy produced by the wavelength of the infrared laser and then melts to form the die bond when the first color micro light emitting diode unit 120 is subsequently irradiated with an infrared laser. The material of the welding material layer 43 can be Sn, SnAgCu, AuSn, etc., which is not limited here.

Figure 2:
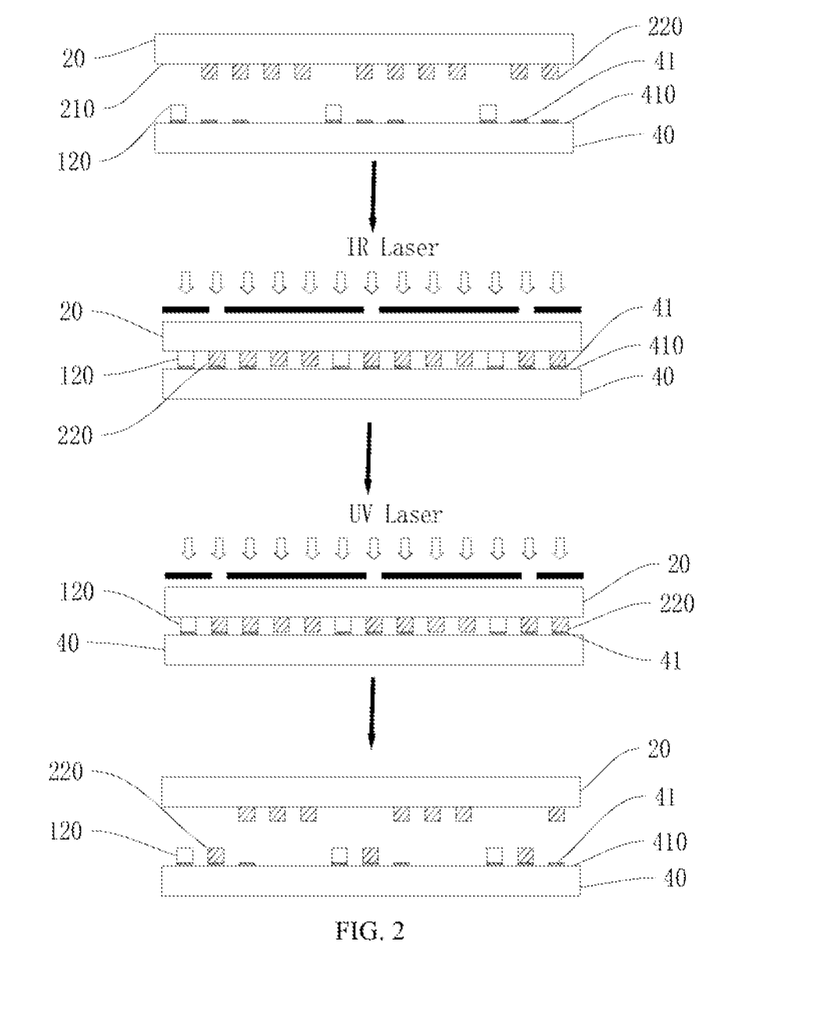
FIG. 2 is a flow chart showing die bonding and peeling of a second color micro light emitting diode unit according to an embodiment of the present disclosure.

In an embodiment, the manufacturing method for the micro light emitting diode substrate further includes:

S210: a second growth substrate 20 is provided, the second growth substrate 20 has a second growth surface 210, and the second growth surface 210 is provided with a second color micro light emitting diode unit 220;

S220: the receiving substrate 40 on which the first color micro light emitting diode unit 120 is fixed is fitted to the second growth substrate 20, such that each second color micro light emitting diode unit 220 at a transfer position is fitted to one receiving pad 41;

S230: the second color micro light emitting diode unit 220 is fixed to the receiving surface 410 through the receiving pad 41;

S240: the second color micro light emitting diode unit 220 is peeled off from the second growth substrate 20 to obtain the receiving substrate 40 on which the first color micro light emitting diode unit 120 and the second color micro light emitting diode unit 220 are fixed.

In this embodiment, the receiving substrate 40 on which the first color micro light emitting diode unit 120 is fixed is fitted to the second growth substrate 20, such that each second color micro light emitting diode unit 220 at the transfer position is fitted to one receiving pad 41. Each second color micro light emitting diode unit 220 at the transfer position directly faces one receiving position on the receiving surface 410. In this embodiment, the receiving position refers to a position where the pixel point does not receive the first color micro light emitting diode unit 120 but is ready to receive the second color micro light emitting diode unit 220.

A plurality of second color micro light emitting diode units 220 are fixed to the receiving surface 410 through the receiving pad 41.

In this embodiment, an infrared laser and an ultraviolet laser can be used with a second mask to die bond and peel off the second color micro light emitting diode unit 220, to obtain the receiving substrate 40 on which the first color micro light emitting diode unit 120 and the second color micro light emitting diode unit 220 are fixed. The shape of the second mask corresponds to the second color micro light emitting diode unit 210 to be selectively transferred. In this embodiment, the second color micro light emitting diode unit 220 can be any color of red, blue, and green except for the color of the first color micro light emitting diode unit 120.

Figure 3:
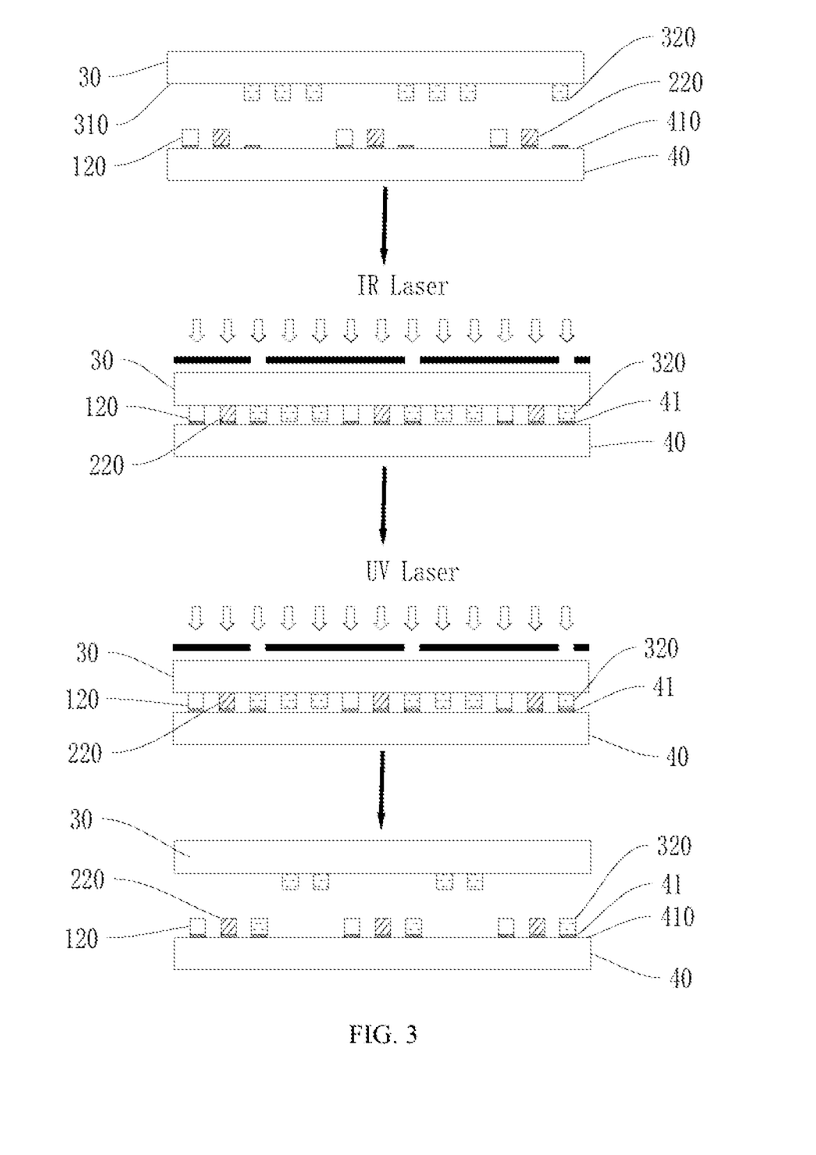
FIG. 3 is a flow chart showing die bonding and peeling of a third color micro light emitting diode unit according to an embodiment of the present disclosure.

In an embodiment, the manufacturing method for the micro light emitting diode substrate further includes:

S310: a third growth substrate 30 is provided; the third growth substrate 30 has a third growth surface 310, and the third growth surface 310 is provided with a third color micro light emitting diode unit 320;

S320: the receiving substrate 40 on which the first color micro light emitting diode unit 120 and the second color micro light emitting diode unit 220 are fixed is fitted to the third growth substrate 30, such that each third color micro light emitting diode unit 320 at the transfer position is fitted to one receiving pad 41;

S330: the third color micro light emitting diode unit 320 is fixed to the receiving surface 410 through the receiving pad 41;

S340: the third color micro light emitting diode unit 320 is peeled off from the third growth substrate 30 to obtain the receiving substrate 40 on which the first color micro light emitting diode unit 120, the second color micro light emitting diode unit 220, and the third color micro light emitting diode unit 320 are fixed.

In this embodiment, the receiving substrate 40 on which the first color micro light emitting diode unit 120 and the second color micro light emitting diode unit 220 are fixed is fitted to the third growth substrate 30, such that each third color micro light emitting diode unit 320 at the transfer position is fitted to one receiving pad 41. Each third color micro light emitting diode unit 320 at the transfer position directly faces a receiving position on the receiving surface 410. In this embodiment, the receiving position refers to a position where the pixel point does not receive the first color micro light emitting diode unit 120 and the second color micro light emitting diode unit 220, but is ready to receive the third color micro light emitting diode unit 320. The third color micro light emitting diode unit 320 is fixed to the receiving surface 410 through the receiving pad 41.

In this embodiment, an infrared laser and an ultraviolet laser can be used with the third mask to die bond and peel off the third color micro light emitting diode unit 320, to obtain the receiving substrate 40 on which the first color micro light emitting diode unit 120, the second color micro light emitting diode unit 220 and the third color micro light emitting diode unit 320 are fixed. The shape of the third mask corresponds to the third color micro light emitting diode unit 320 needing to be transferred. In this embodiment, the color of the third color micro light emitting diode unit 320 can be the red, blue and green except for the colors of the first color micro light emitting diode unit 120 and the second color micro light emitting diode unit 220.

Figure 4:
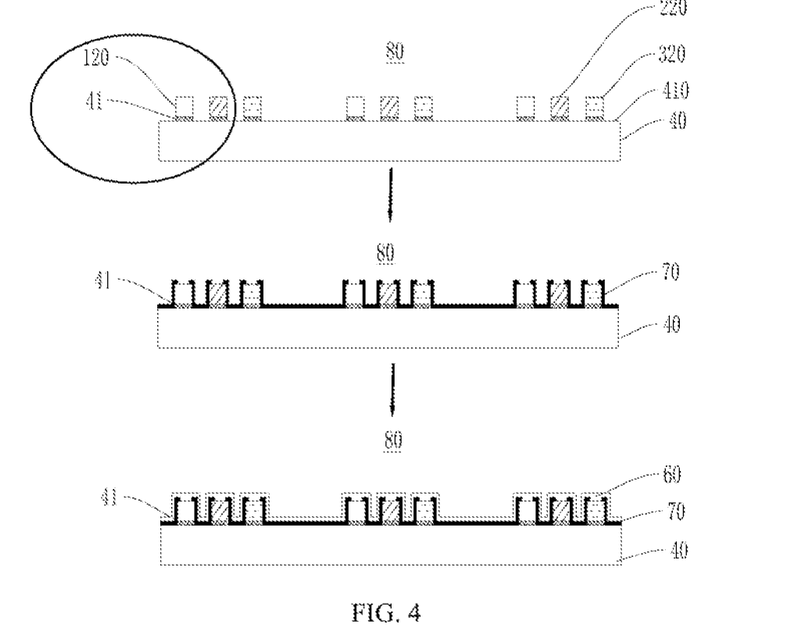
FIG. 4 is a flow chart showing manufacturing of a protective layer and an electrode layer of a micro light emitting diode substrate according to an embodiment of the present disclosure.

In an embodiment, the manufacturing method for the micro light emitting diode substrate further includes: at S350, a protective layer 70 and a transparent electrode layer 60 are provided in sequence on a surface of each of the first color micro light emitting diode unit 120, the second color micro light emitting diode unit 220 and the third color micro light emitting diode unit 320 which are transferred to the receiving substrate 40.

In this embodiment, in the step S340, the micro light emitting diode unit is an unfinished micro light emitting diode. Therefore, after the micro light emitting diode unit is transferred onto the receiving substrate 40, a second electrode is formed on the micro light emitting diode unit on the surface of the receiving substrate 40, thereby forming a micro light emitting diode having a complete vertical structure. Therefore, the manufacturing method for the micro light emitting diode substrate further includes: at S350, a protective layer 70 and a transparent electrode layer 60 are provided in sequence on a surface of each of the first color micro light emitting diode unit 120, the second color micro light emitting diode unit 220, and the third color micro light emitting diode unit 320 which are transferred to the receiving substrate 40. The material of the transparent electrode can include ITO, metal, etc.; and the light transmittance of the transparent electrode is greater than 50%. The protective layer 70 is provided with an opening so that the transparent electrode layer 60 is in contact with the epitaxial layer of the micro light emitting diode unit to form the other electrode of the micro light emitting diode unit.

In an embodiment, any one, two or three of the first color micro light emitting diode unit 120, the second color micro light emitting diode unit 220, and the third color micro light emitting diode unit 320 have a vertical structure.

In this embodiment, any one of the first color micro light emitting diode unit 120, the second color micro light emitting diode unit 220, and the third color micro light emitting diode unit 320 can have a vertical structure; or any two or all of the first color micro light emitting diode unit 120, the second color micro light emitting diode unit 220, and the third color micro light emitting diode unit 320 have a vertical structure at the same time, which is not limited herein.

In this embodiment, since the size of the micro light emitting diode is generally less than 100 um, in order to improve the transfer yield, the micro light emitting diode having the vertical structure is generally used. In an embodiment, the first color micro light emitting diode unit 120, the second color micro light emitting diode unit 220, and the third color micro light emitting diode unit 320 all use the micro light emitting diodes having the vertical structure, which can provide a display panel with a higher resolution.

In an embodiment, the thickness of the protective layer 70 is in a range of 0.1 um to 3 um.

In this embodiment, the protective layer 70 can be made of an insulating material such as silicon dioxide, silicon nitride, or organic polymer, or can be a Bragg reflecting layer with a high reflectivity and insulation. The thickness of the protective layer 70 is in a range of 0.1 um to 3 um. In such a way, problems of electric leakage and high growth cost caused respectively by too thin or too thick protective layer 70 can be avoided.

An embodiment of the present disclosure further provides a micro light emitting diode substrate 80, which is formed by any of the above-mentioned manufacturing methods for the micro light emitting diode substrate.

An embodiment of the present disclosure further provides a display device, which includes any one of the above-mentioned micro light emitting diode substrates 80.

The technical features of the above-mentioned embodiments can be combined arbitrarily. In order to make the description concise, all possible combinations of the various technical features in the above-mentioned embodiments are not described. However, as long as there is no contradiction in the combinations of these technical features, they should be considered as the scope of the present disclosure.

The above-mentioned embodiments are merely several exemplary embodiments of the present disclosure, and the description is relatively specific and detailed, but it should not be understood as a limitation to the protection scope of the present disclosure. It should be pointed out that those of ordinary skill in the art can make several variations and improvements without departing from the concept of the present disclosure, and these all fall within the protection scope of the present disclosure. Therefore, the scope of protection of the present disclosure shall be subject to the appended claims.

What is claimed is:

1. A method for manufacturing a micro light emitting diode substrate, comprising:
- S110: providing a first growth substrate, the first growth substrate having a first growth surface, and the first growth surface being provided with a first color micro light emitting diode unit;
- S120: providing a receiving substrate, the receiving substrate having a receiving surface, and a plurality of receiving pads being arranged on the receiving surface at intervals;
- S130: fitting the first growth substrate to the receiving substrate such that each first color micro light emitting diode unit at a transfer position is fitted to one receiving pad;
- S140: fixing the first color micro light emitting diode unit to the receiving surface through the receiving pad;
- S150: peeling off the first color micro light emitting diode unit from the first growth substrate, to obtain the receiving substrate on which the first color micro light emitting diode unit is fixed;
- wherein, in the S130, a micro light emitting diode pad is provided on a side of each first color micro light emitting diode unit at the transfer position, the side is fitted to the receiving pad, and a welding material layer is provided on a side of the micro light emitting diode pad fitted to the receiving pad.

2. The method for manufacturing the micro light emitting diode substrate according to claim 1, wherein the S140 comprises:
- S141: providing a first mask, the first mask being provided on a side of the first growth substrate away from the first growth surface, and irradiating, by an infrared laser, a side of the first mask away from the first growth substrate;
- S142: fixing a plurality of first color micro light emitting diode units to the receiving surface through the receiving pads.

3. The method for manufacturing the micro light emitting diode substrate according to claim 2, wherein in the S141, the first mask is provided with at least one opening.

4. The method for manufacturing the micro light emitting diode substrate according to claim 2, wherein the S150 comprises:
- S151: switching the infrared laser to an ultraviolet laser, providing a second mask, the second mask being provided on a side of the first growth substrate away from the first growth surface, and irradiating, by the ultraviolet laser, a side of the second mask away from the first growth substrate;
- S152: absorbing, by the first color micro light emitting diode unit, an energy generated by the ultraviolet laser to decompose and vaporize, to implement the peeling off from the first growth surface of the first growth substrate.

5. The method for manufacturing the micro light emitting diode substrate according to claim 4, wherein in the S151, the second mask and the first mask are a same mask.

6. The method for manufacturing the micro light emitting diode substrate according to claim 4, wherein the infrared laser or the ultraviolet laser is a large spot laser, a linear spot laser, or a point spot laser.

7. The method for manufacturing the micro light emitting diode substrate according to claim 1, further comprising:
- S210: providing a second growth substrate, the second growth substrate having a second growth surface, and the second growth surface being provided with a second color micro light emitting diode unit;
- S220: fitting the receiving substrate on which the first color micro light emitting diode unit is fixed to the second growth substrate, such that each second color micro light emitting diode unit at a transfer position is fitted to one receiving pad;
- S230: fixing the second color micro light emitting diode unit to the receiving surface through the receiving pad;
- S240: peeling off the second color micro light emitting diode unit from the second growth substrate, to obtain the receiving substrate on which the first color micro light emitting diode unit and the second color micro light emitting diode unit are fixed.

8. The method for manufacturing the micro light emitting diode substrate according to claim 7, further comprising:
- S310: providing a third growth substrate, the third growth substrate having a third growth surface, and the third growth surface being provided with a third color micro light emitting diode unit;
- S320: fitting the receiving substrate on which the first color micro light emitting diode unit and the second color micro light emitting diode unit are fixed to the third growth substrate, such that each third color micro light emitting diode unit at a transfer position is fitted to one receiving pad;
- S330: fixing the third color micro light emitting diode unit to the receiving surface through the receiving pad;
- S340: peeling off the third color micro light emitting diode unit from the third growth substrate, to obtain the receiving substrate on which the first color micro light emitting diode unit, the second color micro light emitting diode unit and the third color micro light emitting diode unit are fixed.

9. The method for manufacturing the micro light emitting diode substrate according to claim 8, further comprising: at S350, providing a protective layer and a transparent electrode layer in sequence on a surface of each of the first color micro light emitting diode unit, the second color micro light emitting diode unit and the third color micro light emitting diode unit which are transferred to the receiving substrate.

10. The method for manufacturing the micro light emitting diode substrate according to claim 8, wherein any one, two or three of the first color micro light emitting diode unit, the second color micro light emitting diode unit, and the third color micro light emitting diode unit have a vertical structure.

11. The method for manufacturing the micro light emitting diode substrate according to claim 9, wherein a thickness of the protective layer is in a range of 0.1 um to 3 um.

12. A micro light emitting diode substrate, formed by the method of claim 1.

13. A display device, comprising the micro light emitting diode substrate according to claim 12.

* * * * *